(12) United States Patent
Dakshina-Murthy et al.

(10) Patent No.: US 7,737,021 B1
(45) Date of Patent: *Jun. 15, 2010

(54) RESIST TRIM PROCESS TO DEFINE SMALL OPENINGS IN DIELECTRIC LAYERS

(75) Inventors: Srikanteswara Dakshina-Murthy, Austin, TX (US); Paul R. Besser, Austin, TX (US); Jonathan B. Smith, Fremont, CA (US); Eric M. Apelgren, Austin, TX (US); Christian Zistl, Dresden (DE); Jeremy I. Martin, Austin, TX (US); Lie Larry Zhao, Austin, TX (US); Nicholas John Kepler, Saratoga, CA (US)

(73) Assignee: Globalfoundries Inc., Austin, TX (US)

( * ) Notice: Subject to any disclaimer, the term of this patent is extended or adjusted under 35 U.S.C. 154(b) by 1372 days.

This patent is subject to a terminal disclaimer.

(21) Appl. No.: 10/261,613

(22) Filed: Sep. 30, 2002

Related U.S. Application Data

(63) Continuation of application No. 09/731,577, filed on Dec. 6, 2000, now Pat. No. 6,500,755.

(51) Int. Cl.
*H01L 21/4763* (2006.01)
(52) U.S. Cl. .............. 438/622; 438/637; 257/E21.577
(58) Field of Classification Search ........... 438/618, 438/622, 624, 626, 633, 637, 638, 668, 670, 438/672, 671, 666, 675, 725, 645, 623, 424, 438/444, 445, 453; 257/E21.577
See application file for complete search history.

(56) References Cited

U.S. PATENT DOCUMENTS

| | | | |
|---|---|---|---|
| 5,139,904 A * | 8/1992 | Auda et al. ................. 430/30 |
| 5,482,894 A * | 1/1996 | Havemann ................. 438/623 |
| 5,629,772 A | 5/1997 | Ausschnitt ................. 356/372 |
| 5,655,110 A | 8/1997 | Krivokapic et al. ......... 395/500 |
| 5,773,174 A | 6/1998 | Koizumi et al. ............. 430/30 |
| 5,804,088 A * | 9/1998 | McKee ....................... 216/47 |
| 5,926,690 A | 7/1999 | Toprac et al. ............... 438/17 |
| 5,939,130 A | 8/1999 | Shiraishi et al. ............. 427/9 |
| 6,004,047 A | 12/1999 | Akimoto et al. ............ 396/604 |
| 6,072,191 A | 6/2000 | La et al. ..................... 257/48 |
| 6,103,559 A * | 8/2000 | Gardner et al. ............. 438/183 |
| 6,221,777 B1 * | 4/2001 | Singh et al. ................ 438/692 |
| 6,221,787 B1 | 4/2001 | Ogata ......................... 438/758 |
| 6,297,170 B1 * | 10/2001 | Gabriel et al. .............. 438/738 |
| 6,315,637 B1 * | 11/2001 | Apelgren et al. ............ 451/30 |
| 6,500,755 B2 * | 12/2002 | Dakshina-Murthy et al. ..... 438/637 |

FOREIGN PATENT DOCUMENTS

| | | |
|---|---|---|
| EP | 0 810 633 A2 | 12/1997 |
| EP | 0 863 438 A1 | 9/1998 |
| JP | 11340134 | 10/1999 |

* cited by examiner

*Primary Examiner*—Michael Trinh
(74) *Attorney, Agent, or Firm*—Williams, Morgan & Amerson

(57) ABSTRACT

The present invention is directed to a method of forming semiconductor devices. In one illustrative embodiment, the method comprises defining a photoresist feature having a first size in a layer of photoresist that is formed above a layer of dielectric material. The method further comprises reducing the first size of the photoresist feature to produce a reduced size photoresist feature, forming an opening in the layer of dielectric material under the reduced size photoresist feature, and forming a conductive material in the opening in the layer of dielectric material.

26 Claims, 8 Drawing Sheets

RESIST TRIM PROCESS TO DEFINE SMALL OPENINGS IN DIELECTRIC LAYERS

This is a continuation of application Ser. No. 09/731,577 filed Dec. 6, 2000 now U.S. Pat. No. 6,500,755.

BACKGROUND OF THE INVENTION

1. Field of the Invention

The present invention is generally directed to semiconductor processing, and, more particularly, to a resist trim method for forming openings in a dielectric layer for conductive interconnections.

2. Description of the Related Art

There is a constant drive to reduce the channel length of transistors to increase the overall speed of the transistor, as well as integrated circuit devices incorporating such transistors. A conventional integrated circuit device, such as a microprocessor, is typically comprised of many thousands of semiconductor devices, e.g., transistors, formed above the surface of a semiconducting substrate. For the integrated circuit device to function, the transistors must be electrically connected to one another through conductive interconnections.

Many modern integrated circuit devices are very densely packed, i.e., there is very little space between the transistors formed above the substrate. Thus, these conductive interconnections must be made in multiple layers to conserve plot space on the semiconducting substrate. This is typically accomplished through the formation of a plurality of conductive lines and conductive plugs formed in alternative layers of dielectric materials formed on the device. The conductive plugs are means by which various layers of conductive lines, and/or semiconductor devices, may be electrically coupled to one another. The conductive lines and plugs may be made of a variety of conductive materials, such as copper, aluminum, aluminum alloys, titanium, tantalum, titanium nitride, tantalum nitride, tungsten, etc.

As stated previously, an integrated circuit device is comprised of many thousands of transistors. An illustrative transistor 10 that may be included in such an integrated circuit device is shown in FIG. 1. The transistor 10 is generally comprised of a gate dielectric 14, a gate conductor 16, and a plurality of source/drain regions 18 formed in a semiconducting substrate 12. The gate dielectric 14 may be formed from a variety of dielectric materials, such as silicon dioxide. The gate conductor 16 may also be formed from a variety of materials, such as polysilicon. The source and drain regions 18 may be formed by one or more ion implantation processes in which a dopant material is implanted into the substrate 12.

Next, a first dielectric layer 26 is formed above the transistor 10, and a plurality of vias or openings 24 are formed in the first dielectric layer 26. Thereafter, the vias 24 are filled with a conductive material, such as a metal, to form contacts 22. In the illustrative transistor 10 shown in FIG. 1, the contacts 22 are electrically coupled to the source and drain regions 18 of the transistor 10. Thereafter, a second dielectric layer 32 may be formed above the first dielectric layer 26. Multiple openings 30 may be formed in the second dielectric layer 32, and the openings 30 may thereafter be filled with a conductive material to form conductive lines 28. Although only a single level of contacts and a single level of conductive lines are depicted in FIG. 1, there may be multiple levels of contacts and lines interleaved with one another. This interconnected network of contacts and lines allows electrical signals to propagate throughout the integrated circuit device. The techniques used for forming the various components depicted in FIG. 1 are known to those skilled in the art and will not be repeated here in any detail.

In general, the various features of a semiconductor device, e.g., the gate electrode and the conductive interconnections of a typical field-effect transistor, are manufactured by a continual process of forming various layers of material, selectively removing, or patterning, portions of those layers, and, in some cases, forming additional layers of materials in openings defined in the layers. For example, to form a gate electrode of an illustrative field-effect transistor, a layer of material, such as polysilicon, may be deposited above a surface of a semiconducting substrate. Thereafter, portions of the polysilicon layer are removed, leaving what will become the gate electrode in place above the semiconducting substrate, i.e., the polysilicon layer is patterned to define a gate electrode.

The patterning of these various process layers is typically accomplished using known photolithography and etching process. In general, photolithography is a process in which a layer of photoresist, a material whose structure may be changed upon exposure to a light source, is formed above a process layer in which it is desired to form a feature of a semiconductor device. Essentially, the image that is desired to ultimately be formed in the underlying process layer will first be formed in the layer of photoresist by exposing portions of the photoresist layer to an appropriate light source. Following development of the photoresist layer, the remaining portions of the photoresist layer will be resistant to subsequent etching processes to be performed on the semiconductor device. The desired features of the semiconductor device are then formed in the underlying process layer by performing one or more wet or dry etching processes to remove the portions of underlying process layer that are not protected by the feature defined in the layer of photoresist.

However, as semiconductor feature sizes continue to decrease, it is desirable to form feature sizes to dimensions that are less than can be directly defined by standard photolithographic processes. In particular, due to the continual trend to produce more densely-packed integrated circuit devices, it is desirable to be able to form conductive interconnections to sizes smaller than can be achieved with traditional photolithographic techniques.

The present invention is directed to a method of making a semiconductor device that minimizes or reduces some or all of the aforementioned problems.

SUMMARY OF THE INVENTION

The present invention is directed to a method of forming semiconductor devices. In one illustrative embodiment, the method comprises forming a layer of dielectric material, forming a layer of photoresist above the dielectric material, and defining a photoresist feature of a first size in the layer of photoresist. The method further comprises reducing the first size of the photoresist feature to define a reduced size photoresist feature, forming an opening in the layer of dielectric material in the area defined by the reduced size photoresist feature, and forming a conductive material in the opening in the layer of dielectric material.

BRIEF DESCRIPTION OF THE DRAWINGS

The invention may be understood by reference to the following description taken in conjunction with the accompanying drawings, in which like reference numerals identify like elements, and in which.

Figure 1:
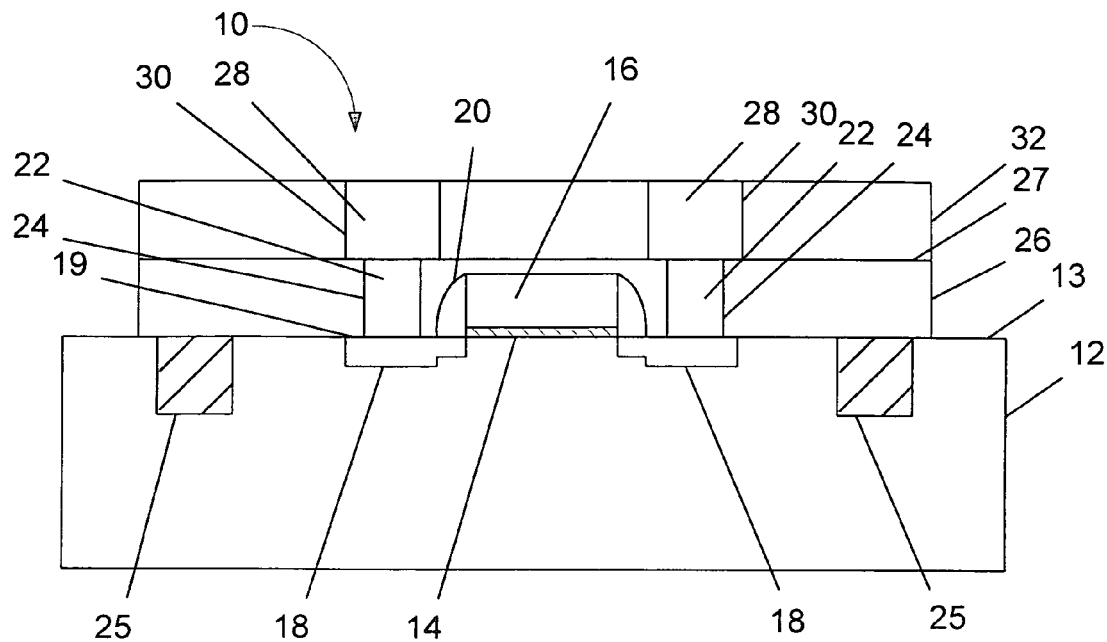
FIG. 1 is a cross-sectional view of an illustrative prior art semiconductor device.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to FIGS. 2-15. Although the various regions and structures of a semiconductor device are depicted in the drawings as having very precise, sharp configurations and profiles, those skilled in the art recognize that, in reality, these regions and structures are not as precise as indicated in the drawings. Additionally, the relative sizes of the various features depicted in the drawings may be exaggerated or reduced as compared to the size of those feature sizes on fabricated devices. Nevertheless, the attached drawings are included to describe and explain illustrative examples of the present invention.

In general, the present invention is directed to a method of forming openings for conductive interconnections in a dielectric layer in a semiconductor device. As will be readily apparent to those skilled in the art upon a complete reading of the present application, the present method is applicable to a variety of technologies, e.g., NMOS, PMOS, CMOS, etc., and it is readily applicable to a variety of devices, including, but not limited to, logic devices, memory devices, etc. FIGS. 2-8 depict one illustrative embodiment of the present invention. FIGS. 9-15 depict yet another illustrative embodiment of the present invention. Of course, there are other possible embodiments of the invention other than those depicted in FIGS. 2-15. Thus, the present invention should not be considered limited to the embodiments depicted in the attached drawings.

Figure 2:
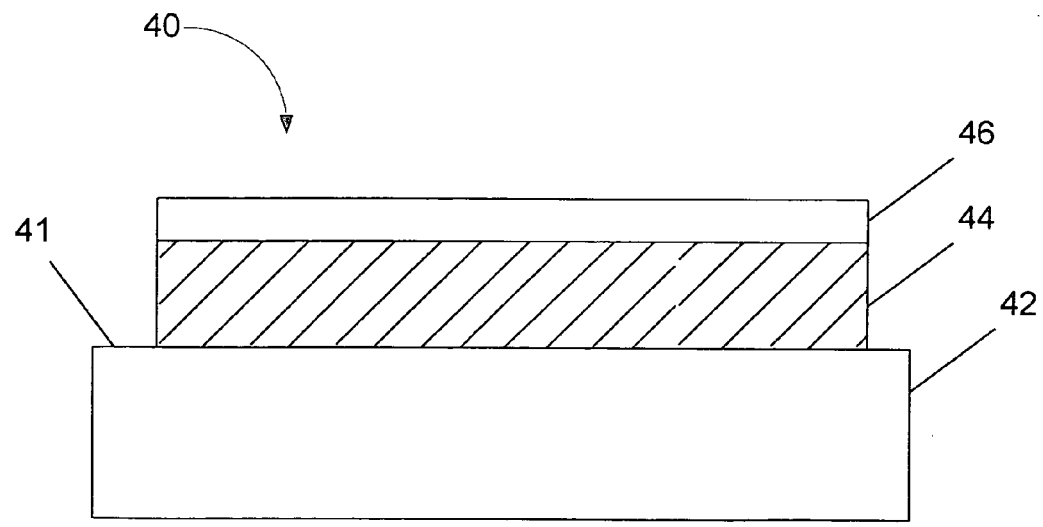
FIG. 2 is a cross-sectional view of a partially formed semiconductor device in accordance with one illustrative embodiment of the present invention.

As shown in FIG. 2, in one illustrative embodiment, a partially formed interconnect structure 40 is comprised of a layer of dielectric material 44 formed above a surface 41 of a structure 42, and a protective or cap layer 46 formed above the layer of dielectric material 44. The structure 42 may be any type of structure found in semiconductor processing operations. The structure 42 may be comprised of a partially formed integrated circuit device (not shown in FIG. 2), or it may be a previous metallization layer formed on an integrated circuit device. For example, the structure 42 may be comprised of all the components of the transistor 10 depicted in FIG. 1 that lie in or below the process layer 26. Alternatively, the structure 42 may be comprised of a metallization layer, such as the components depicted in process layer 32 in FIG. 1.

The dielectric layer 44 may be comprised of any material having a relatively low dielectric constant ("k") that is suitable for use as an insulating layer between conductive interconnections formed on an integrated circuit device, e.g., a material having a dielectric constant less than approximately five. For example, the dielectric layer 44 may be comprised of any dielectric material, e.g., silicon dioxide, fluorinated TEOS, carbon-doped oxide, hydrogen silsesquioxane, etc. The dielectric layer 44 may be formed by a variety of known techniques for forming such layers, e.g., physical vapor deposition ("PVD"), chemical vapor deposition ("CVD"), sputtering, etc., and it may have a thickness ranging from approximately 3000-5000 Å. In one illustrative embodiment, the dielectric layer 44 is comprised of a deposited layer of silicon dioxide having a thickness ranging from approximately 3000-5000 Å.

In one illustrative embodiment of the present invention, depicted in FIGS. 2-8, a cap layer 46 may be formed above the dielectric layer 44. The cap layer 46 may be useful in protecting the dielectric material comprising the dielectric layer 44 from subsequent processing operations and to insure stability of the structure in subsequent polishing baths to which the device may be subjected. The cap layer 46 may be comprised of a variety of materials sufficient to withstand subsequent processing operations, e.g., silicon dioxide, fluorinated TEOS, carbon-doped oxide, etc. The cap layer 46 may be formed by a variety of known techniques for forming such layers, e.g., physical vapor deposition ("PVD"), chemical vapor deposition ("CVD"), sputtering, etc., and it may have a thickness ranging from approximately 3000-5000 Å. In one illustrative embodiment, the cap layer 46 is comprised of a deposited layer of silicon dioxide having a thickness ranging from approximately 1500-2500 Å.

Figure 3:
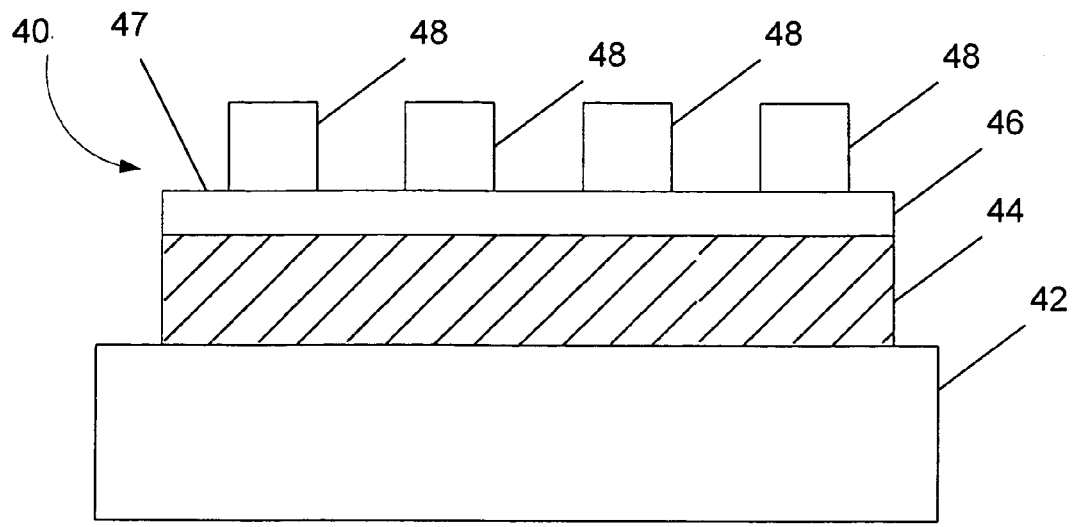
FIG. 3 is a cross-sectional view of the device depicted in FIG. 2 after a layer of photoresist has been formed and patterned thereabove.

Next, a layer of photoresist (not shown) is formed above a surface 47 of the cap layer 46 and patterned using traditional photolithography processes to result in a plurality of photoresist features 48, as shown in FIG. 3. The layer of photoresist may be formed by a variety of techniques, e.g., spin-coating the photoresist on the surface of the wafer. The thickness of the layer of photoresist may range from approximately 4000-6000 Å. As is known to those skilled in the art, the photoresist features 48 may take any size, shape or configuration, depending upon the particular feature to be defined in underlying process layers. In one illustrative embodiment where it is desired to form holes in the dielectric layer 44, the photoresist features 48 are essentially cylinders of photoresist material. For situations in which it is desired to define metal lines in the underlying dielectric layer 44, the photoresist features 48 would be essentially elongated rectangular shapes that run in a given pattern across the surface of the wafer.

Figure 4:
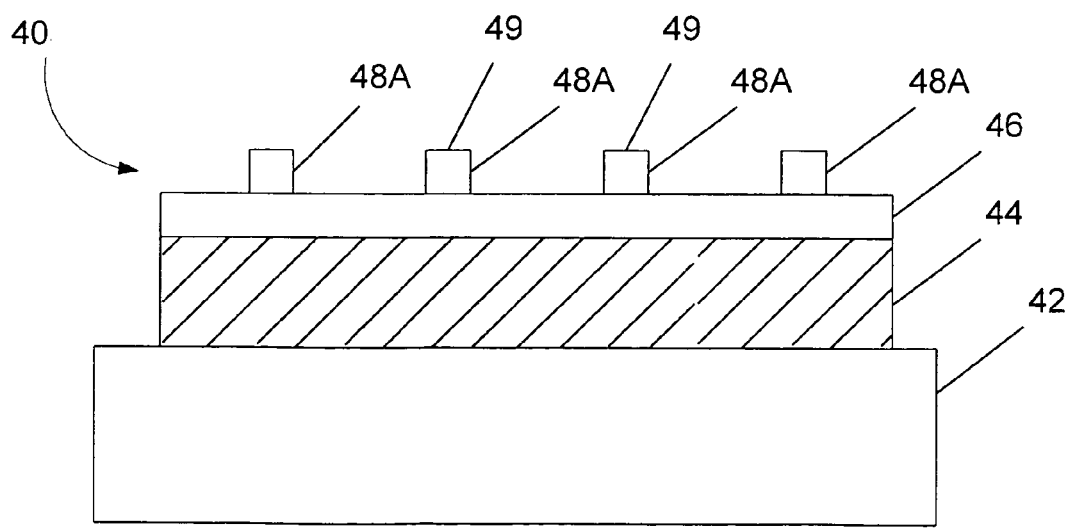
FIG. 4 is a cross-sectional view of the device depicted in FIG. 3 after the photoresist features have been reduced in size.

Next, as shown in FIG. 4, the photoresist features 48 are reduced in size to result in reduced photoresist features 48A. The reduced photoresist features 48A are of a size that is less than may be directly defined using photolithographic processes. The reduced photoresist features 48A may be produced by a variety of known techniques, such as by performing an ashing process. This may be carried out using ashing equipment commonly found in semiconductor processing operations, or by using the requisite chemistry in a conventional plasma etch tool which is used to etch the cap layer 46. Essentially, the ashing process involves burning away portions of the photoresist features 48 shown in FIG. 3 to result in the smaller reduced photoresist features 48A shown in FIG. 4. The amount and magnitude of the reduction that may be accomplished by the ashing process may be controlled by varying one or more parameters of the ashing process. For example, the ashing chemistry, the power supplied during the ashing process, and/or the duration of the ashing process may be varied to affect the amount of the original photoresist features 48 removed in the ashing process. In theory, reducing the size of the original photoresist features 48 may also be accomplished by a wet etching process, although it is believed that controlling such a process would be more difficult.

Additionally, the amount of material removed will depend in part upon the size of the resulting feature to be formed in the dielectric layer 44, as shown in FIG. 4. In one illustrative example, where it is desired to form holes in the dielectric layer 44, the photoresist features 48 (shown in FIG. 4) may be comprised of cylinders of material having a diameter of approximately 2000 Å. Thereafter, an ashing process may be used to reduce the size of the photoresist features 48 to, for example, a diameter of approximately 1500 Å, as depicted by the reduced photoresist features 48A in FIG. 4.

The illustrated reduction between the photoresist features 48 depicted in FIG. 3 and the reduced photoresist features 48A depicted in FIG. 4 is not to scale. It should also be noted that, although the reduced photoresist features 48A depicted in FIG. 4 are represented as having very precise and sharp contours, those skilled in the art will recognize that, during the ashing process, these features may become more rounded and contoured in shape. Nevertheless, the result is to produce a reduced photoresist feature 48A that is smaller in size than a feature size that may be directly patterned with then existing photolithography equipment and techniques. Moreover, although the illustrative example where it is desired to form holes having a diameter of approximately 1500 Å is discussed herein, it is readily apparent that the present invention may be used to form a variety of types of openings of a variety of different sizes in the dielectric layer 44.

Figure 5:
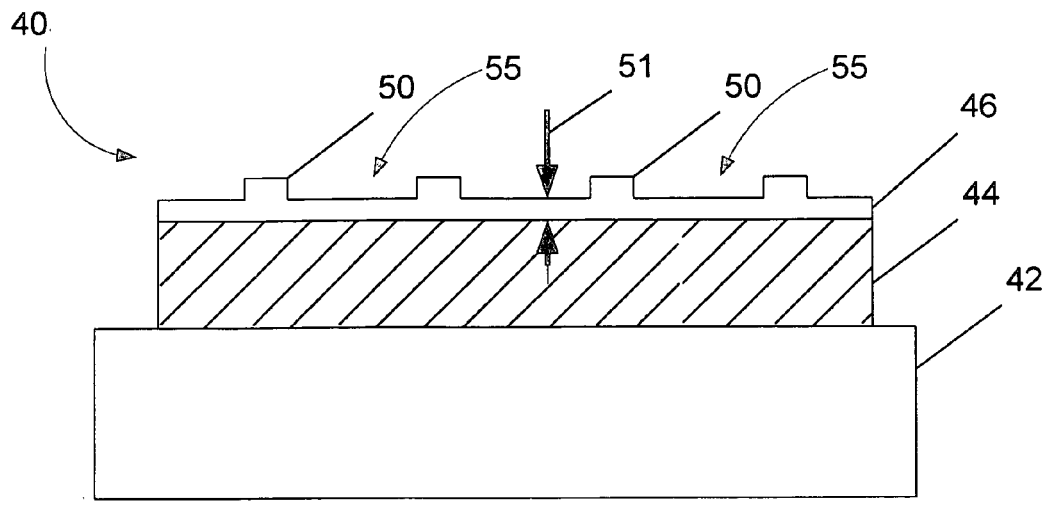
FIG. 5 is a cross-sectional view of the device depicted in FIG. 4 after an etching process has been formed and the reduced photoresist features have been removed.

Next, the structure depicted in FIG. 5 is the result of performing an etching process to remove portions of the cap layer 46, in situations where the cap layer 46 is used. This is followed by removal of the reduced photoresist features 48A by ashing or wet chemical treatments. During this process, a plurality of recesses 55 are formed in the cap layer 46, whereas the portions 50 of the cap layer 46 lying underneath the reduced photoresist features 48 Å are not etched. Moreover, this partial etching process results in a residual thickness 51 of the cap layer 46 that may be approximately 1000-1500 Å in thickness. The purpose for leaving the residual thickness 51 of the cap layer 46 is that it will assist in protecting the underlying dielectric layer 44 in subsequent processing operations. Of course, the amount of the residual thickness 51 in any particular application may vary depending upon the particular processes used for performing the operations described herein. In particular, the residual thickness 51 may vary depending upon the etch selectivity between the cap layer 46 and a hard mask layer 52 to be described more fully below.

Figure 6:
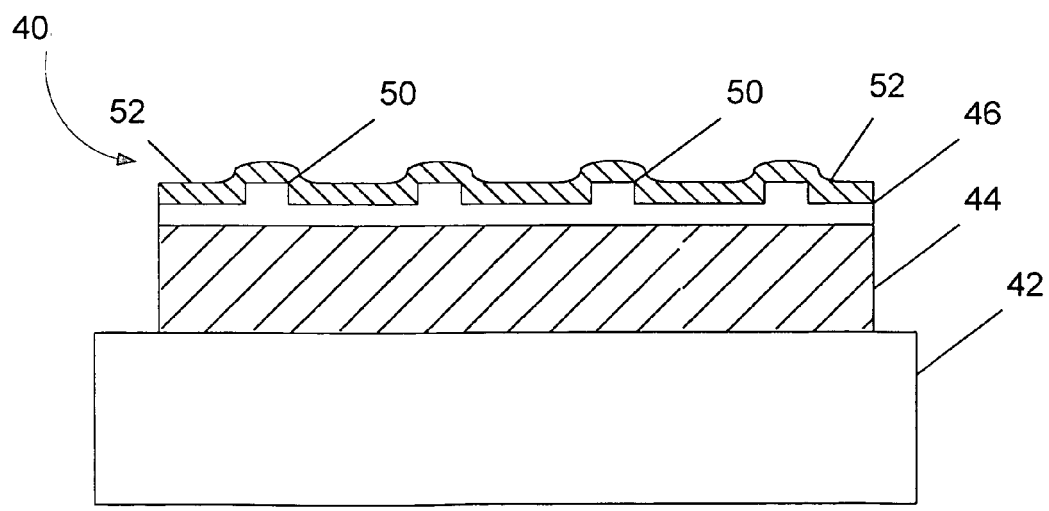
FIG. 6 is a cross-sectional view of the device depicted in FIG. 5 after a hard mask has been formed thereabove.

Next, as shown in FIG. 6, a hard mask layer 52 is formed above the structure depicted in FIG. 5. The hard mask layer 52 may be comprised of a variety of materials, such as silicon nitride, silicon oxynitride, or carbon-doped oxide, and it may have a thickness ranging from approximately 1000-2000 Å. Moreover, the hard mask layer 52 may be formed by any of a variety of known techniques, e.g., CVD, PVD, sputtering, etc. In one illustrative embodiment, the hard mask layer 52 is comprised of a deposited layer of silicon nitride having a thickness ranging from approximately 1000-2000 Å.

Figure 7:
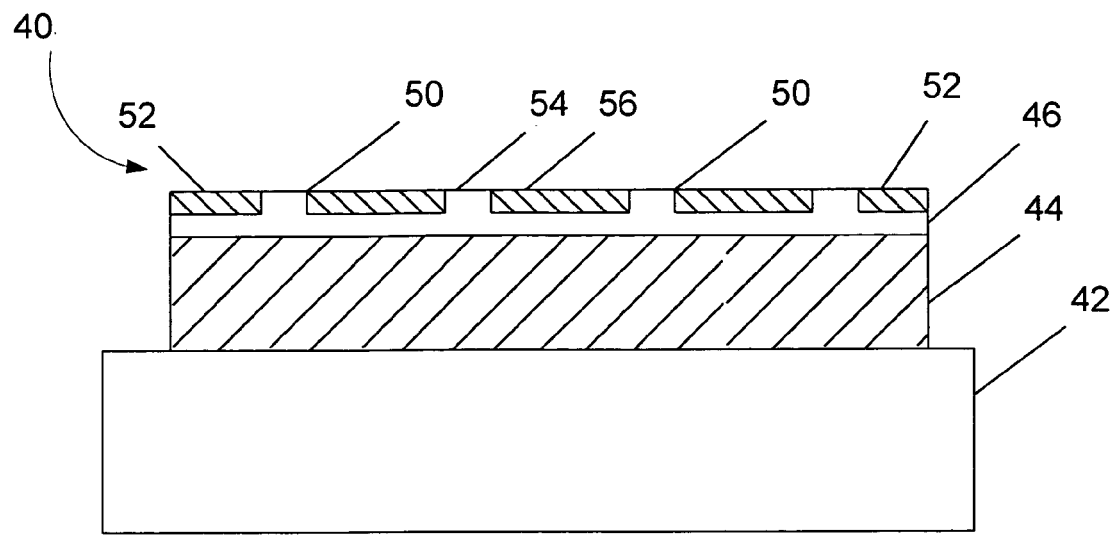
FIG. 7 is a cross-sectional view of the device depicted in FIG. 6 after it has been subjected to a planarization operation.

Next, as shown in FIG. 7, the device in FIG. 6 is subjected to a planarization operation, e.g., a chemical mechanical polishing operation, to produce a planar surface. That is, a chemical mechanical polishing operation is performed such that a surface 56 of the hard mask layer 52 is approximately planar with a surface 54 of the portions 50 of the cap layer 46.

Figure 8:
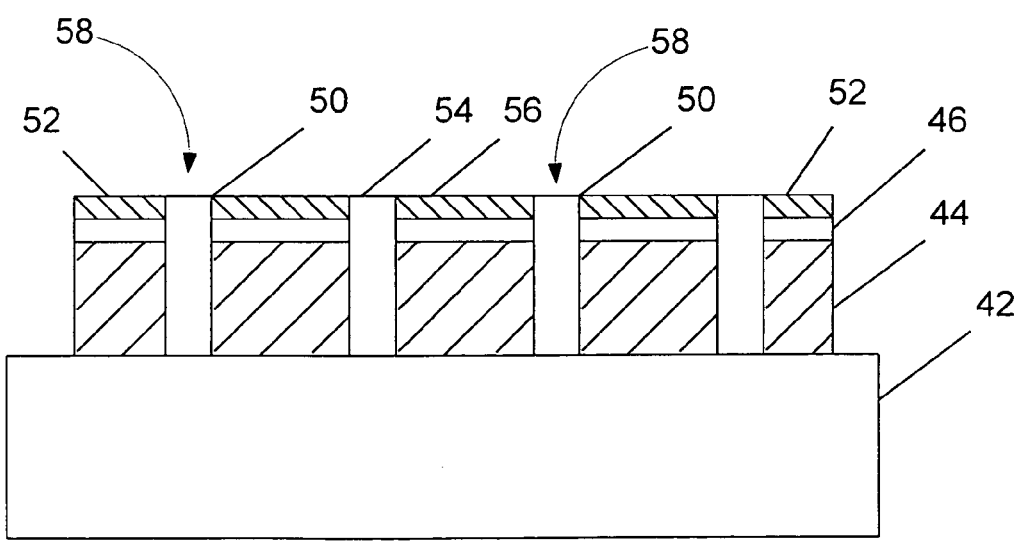
FIG. 8 is a cross-sectional view of the device depicted in FIG. 7 after a plurality of openings have been formed in an underlying dielectric layer.

Thereafter, as shown in FIG. 8, a plurality of openings 58 may be formed in the layer of dielectric material 44 by performing one or more traditional etching operations. During this process, there is a relatively high degree of etch selectivity between the hard mask layer 52 comprised of, for example, silicon nitride, and the material comprising the cap layer 46 and the material comprising the dielectric layer 44. Note that, the openings 58 are formed under the area defined by the reduced size photoresist features 48A. Thereafter, although not depicted in the drawings, a conductive material, such as a metal, e.g., aluminum, copper, tungsten, etc., is formed in the openings 58 to form a conductive interconnection, along which signals will propagate throughout the integrated circuit device.

However, depending upon the material selected for the dielectric layer 44, the cap layer 46 may not be required, i.e., if the material comprising the dielectric layer 44 is robust enough to withstand subsequent processing operations, then the cap layer 46 may be omitted. For example, if the dielectric layer 44 is comprised of silicon dioxide, the cap layer 46 may be omitted. On the other hand, if the dielectric layer is comprised of, for example, hydrogen silsesquioxane ("HSQ"), then a cap layer 46 comprised of approximately 1500-2500 Å of silicon dioxide may be used. In the case where the cap layer 46 is used, it may be formed directly on the dielectric layer 44, and the layer of photoresist may be formed on the cap layer 46.

Figure 9:
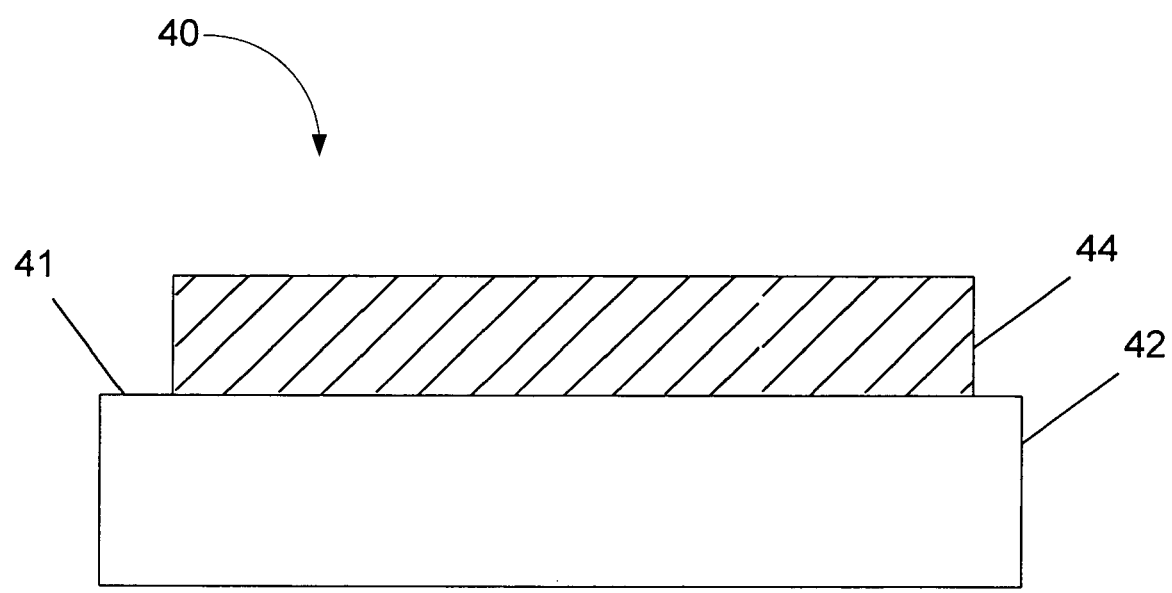
FIGS. 9-15 depict another illustrative embodiment of the present invention.
Figure 10:
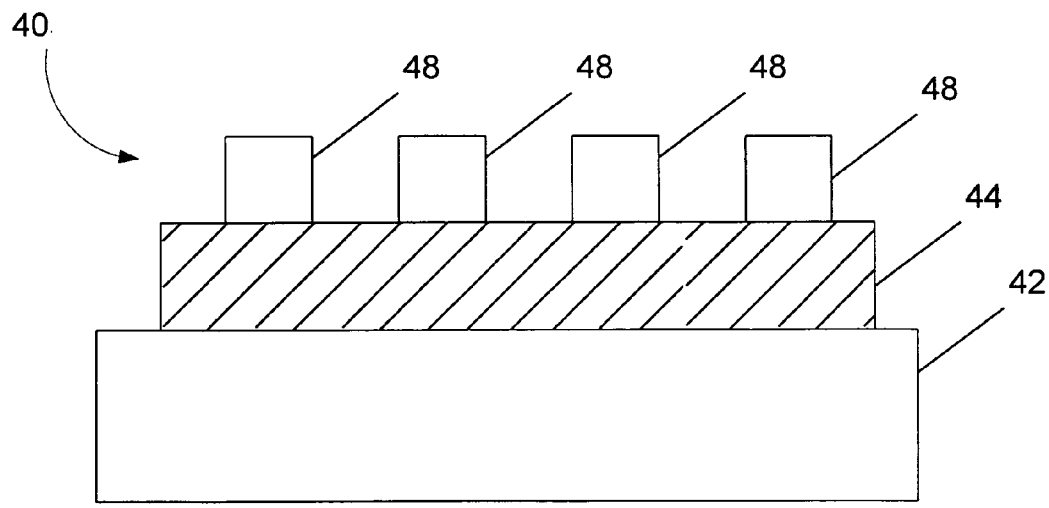
Figure 11:
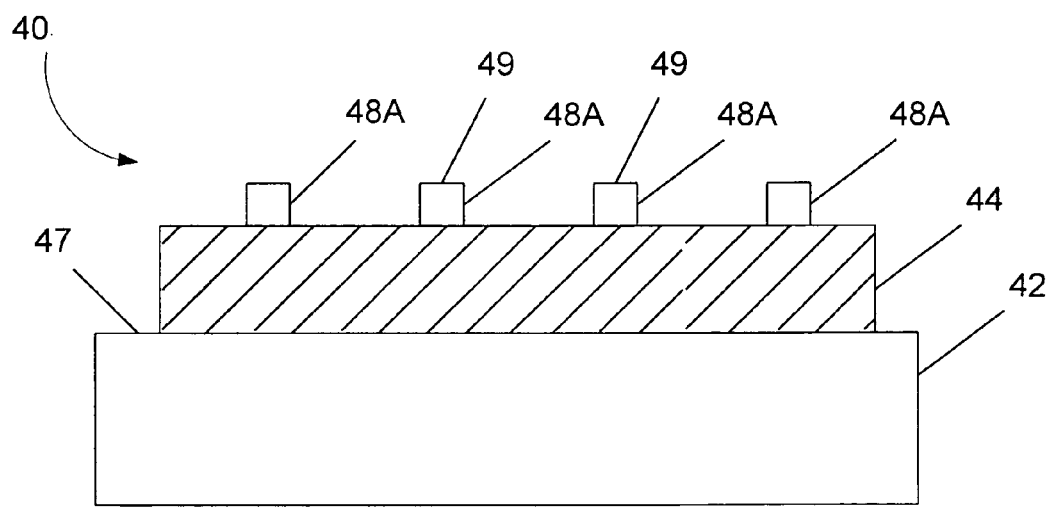

FIGS. 9-15 depict one illustrative embodiment on which the cap layer 46 (described above) may be omitted. As shown in FIG. 9, the dielectric layer 44 may be formed above the structure 42. Thereafter, as shown in FIG. 10, the photoresist features 48 may be formed directly above the dielectric layer 44. The photoresist features 48 are then reduced in size to form the reduced photoresist features 48A above the dielectric layer 44, as shown in FIG. 11.

Figure 12:
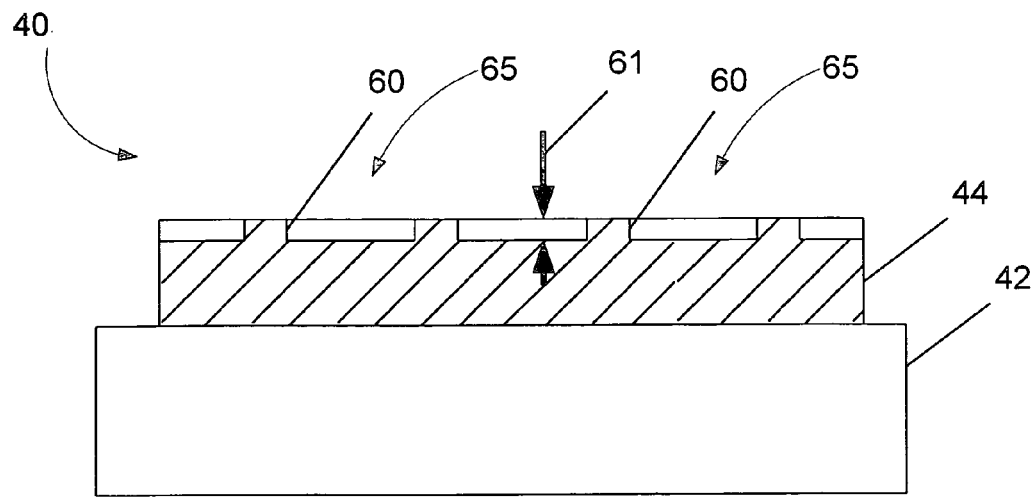

Thereafter, as shown in FIG. 12, a partial etch is performed to form a plurality of recesses 65 in the dielectric layer 44. Note that, during this process, portions 60 of the dielectric layer 44 lying underneath the reduced photoresist features 48A are not etched. This partial etching process is followed by the removal of the reduced photoresist features 48A by ashing or chemical treatments. This partial etching process results in the recesses 65 having a depth 61 that may be approximately 1000-1500 Å. Of course, the depth 61 of the recesses 65 in any particular application may vary depending upon the particular processes used for performing the operations described herein. In particular, the depth 61 of the recesses 65 may vary depending upon the etch selectivity between the dielectric layer 44 and the hard mask layer 52.

Figure 13:
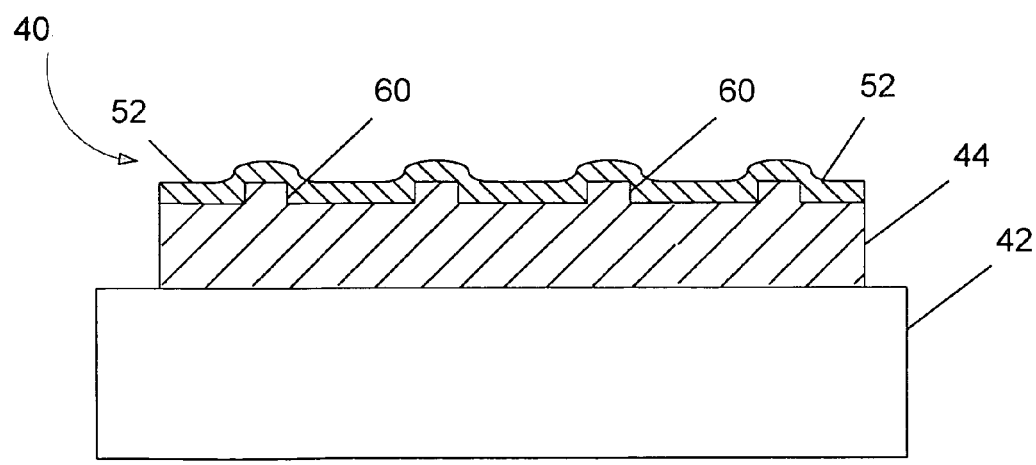
Figure 14:
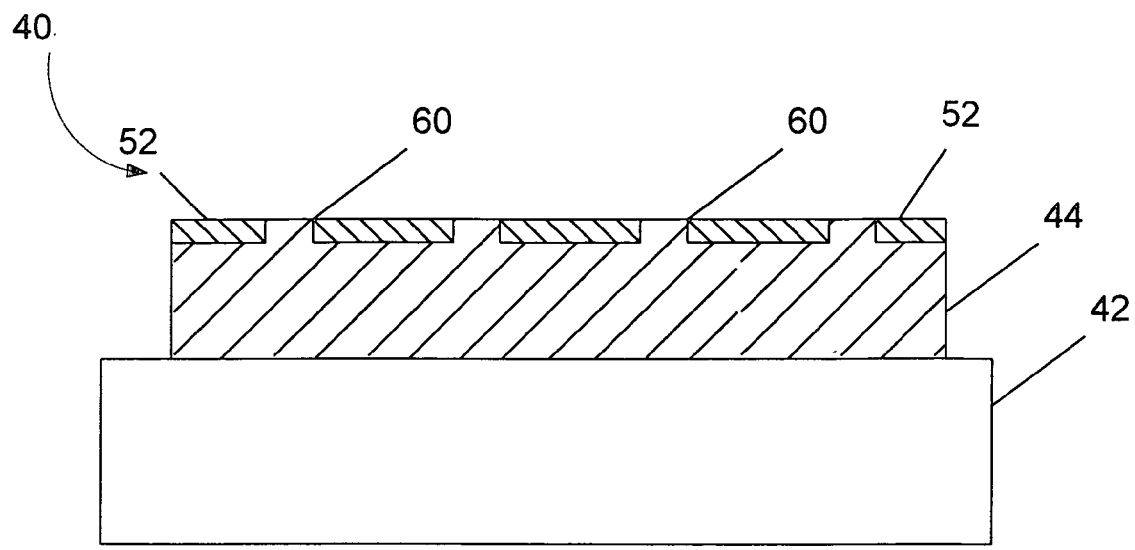
Figure 15:
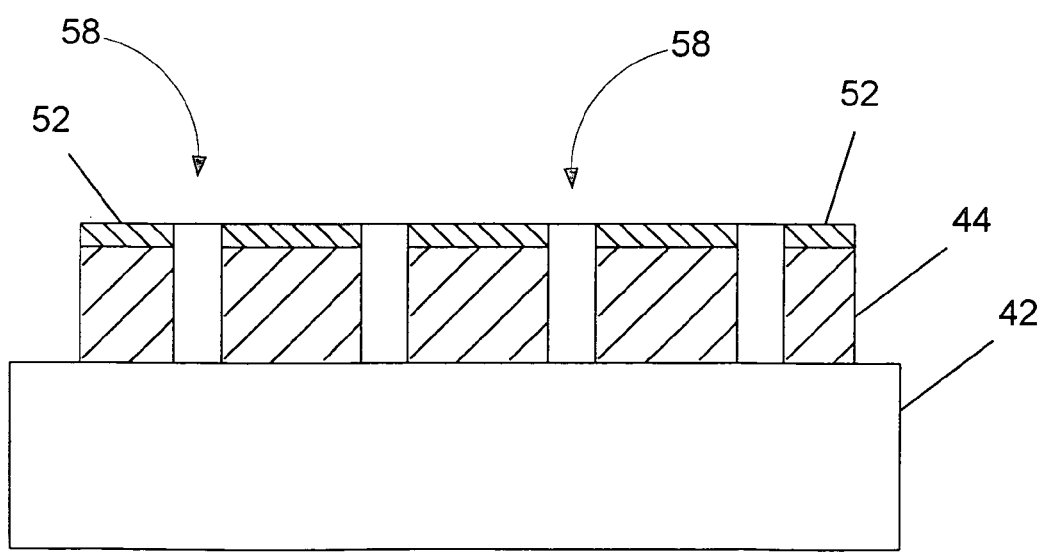

Next, as shown in FIG. 13, the hard mask layer 52 is formed above the dielectric layer 44. Thereafter, the hard mask layer 52 is planarized until such time as the unetched surface of the portions 60 of the dielectric layer 44 are exposed, as shown in FIG. 14. Then, as shown in FIG. 15, a plurality of openings 58 may be formed in the layer of dielectric material 44 by performing one or more traditional etching operations. The openings 58 in the dielectric layer 44 are etched taking advantage of the selectivity of the hard mask layer 52. The openings 58 are formed under the area defined by the reduced size photoresist features 48A. Thereafter, although not depicted in the drawings, a conductive material, such as a metal, is formed in the openings 58 to form a conductive interconnection.

Through use of the present invention, openings for conductive interconnections in dielectric layers may be formed smaller than traditional photolithography equipment and processes would allow. That is, through use of the present invention, conductive interconnections may be formed in openings in dielectric layers in areas that are defined by the reduced size photoresist features 48A described above. This, therefore, enables the formation of smaller interconnect metal vias and metal lines than is possible under current photolithographic constraints. Moreover, the present invention may be employed even as current photolithography processing equipment and techniques are improved so as to enable the definition of smaller and smaller feature sizes for generations of integrated circuit devices to come.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method, comprising:
   forming a layer of dielectric material;
   forming a cap layer above said layer of dielectric material;
   forming a layer of photoresist above said cap layer;
   defining a photoresist feature in said layer of photoresist, said feature having a first size;
   reducing the first size of said photoresist feature to produce a reduced size photoresist feature defining an area having at least one dimension corresponding to the reduced first size of the reduced size photoresist feature;
   forming an opening having at least one dimension corresponding to the reduced first size of the reduced size photoresist feature in said dielectric layer in said area defined by said reduced size photoresist feature, wherein forming the opening comprises:
     partially etching said cap layer to define a plurality of recesses in said cap layer adjacent said reduced size photoresist feature;
     forming a hard mask layer in the plurality of recesses in said partially etched layer of dielectric material;
     etching said dielectric layer in an area defined by the hard mask to form the opening in said layer of dielectric material; and
   forming a conductive material in said opening.

2. The method of claim 1, wherein forming a layer of dielectric material comprises depositing a layer of dielectric material.

3. The method of claim 1, wherein forming a layer of dielectric material comprises forming a layer of dielectric material comprised of at least one of silicon dioxide, a carbon-based oxide, and hydrogen silsesquioxane.

4. The method of claim 1, wherein forming a layer of dielectric material comprises forming a layer of dielectric material having a dielectric constant less than five.

5. The method of claim 1, wherein forming a layer of photoresist above said layer of dielectric material comprises spin-coating a layer of photoresist above said layer of dielectric material.

6. The method of claim 1, wherein forming a layer of photoresist above said layer of dielectric material comprises forming a layer of photoresist on said layer of dielectric material.

7. The method of claim 1, wherein forming a layer of photoresist above said layer of dielectric material comprises forming a layer of photoresist on a cap layer formed above said layer of dielectric material.

8. The method of claim 1, wherein defining a photoresist feature in said layer of photoresist, said feature having a first size, comprises selectively exposing portions of said layer of photoresist to a light source and curing said layer of photoresist to define a photoresist feature in said layer of photoresist, said feature having a first size.

9. The method of claim 1, wherein reducing the first size of said photoresist feature to produce a reduced size photoresist feature defining an area comprises performing an ashing process to reduce the first size of said photoresist feature to produce a reduced size photoresist feature defining an area.

10. The method of claim 1, wherein forming an opening in said dielectric layer in said area defined by said reduced size photoresist feature comprises etching an opening in said dielectric layer in said area defined by said reduced size photoresist feature.

11. The method of claim 1, wherein forming a conductive material in said opening comprises forming a conductive material comprised of a metal in said opening.

12. The method of claim 1, wherein forming a conductive material in said opening comprises depositing a conductive material in said opening.

13. The method of claim 1, further comprising removing said reduced size photoresist feature prior to forming said opening in said dielectric layer in said area defined by said reduced size photoresist features.

14. The method of claim 13, wherein said opening is formed in said dielectric layer under said area defined by said reduced size photoresist feature.

15. A method, comprising:
   forming a layer of dielectric material;
   forming a layer of photoresist above said layer of dielectric material;
   defining a photoresist feature in said layer of photoresist, said photoresist feature having a critical dimension;
   reducing the critical dimension of said photoresist feature to produce a reduced size photoresist feature defining an area;
   forming an opening in said dielectric layer in said area defined by said reduced size photoresist feature; and forming a conductive material in said opening, wherein forming an opening in said dielectric layer in said area defined by said reduced size photoresist feature comprises:
  forming said reduced size photoresist feature on said layer of dielectric material;
  partially etching said layer of dielectric material to define a plurality of recesses in said dielectric layer adjacent said reduced size photoresist feature;
  removing said reduced size photoresist feature;
  forming a hard mask layer above said partially etched layer of dielectric material;
  planarizing said hard mask layer to expose a portion of said partially etched layer of dielectric material between said recesses; and
  etching said dielectric layer in an area defined by said exposed portion of said partially etched dielectric layer to define an opening in said layer of dielectric material.

16. The method of claim 15, wherein forming a hard mask layer above said partially etched dielectric layer comprises depositing a layer of silicon nitride above said partially etched dielectric layer.

17. A method, comprising:
  forming a layer of dielectric material;
  forming a layer of photoresist on said layer of dielectric material;
  defining a photoresist feature in said layer of photoresist, said feature having a critical dimension;
  reducing the critical dimension of said photoresist feature to produce a reduced size photoresist feature defining an area;
  partially etching said layer of dielectric material to define a plurality of recesses in said layer of dielectric material adjacent said reduced size photoresist feature;
  forming a hard mask layer above said partially etched layer of dielectric material;
  planarizing said hard mask layer to expose a portion of said partially etched dielectric layer between said recesses;
  etching said layer of dielectric material in said area defined by said exposed portions of said dielectric layer to define an opening in said layer of dielectric material; and
  forming a conductive material in said opening.

18. The method of claim 17, wherein forming a layer of dielectric material comprises forming a layer of dielectric material comprised of at least one of silicon dioxide, a carbon-based oxide, and hydrogen silsesquioxane.

19. The method of claim 17, wherein forming a layer of dielectric material comprises forming a layer of dielectric material having a dielectric constant less than five.

20. The method of claim 17, wherein reducing the critical dimension of said photoresist feature to produce a reduced size photoresist feature comprises performing an ashing process to reduce the critical dimension of said photoresist feature to produce a reduced size photoresist feature.

21. The method of claim 17, wherein forming a hard mask layer above said partially etched layer of dielectric material comprises depositing a layer comprised of at least one of silicon nitride, silicon oxynitride, and a carbon-doped oxide above said partially etched layer of dielectric material.

22. A method, comprising:
  forming a layer of dielectric material;
  forming a cap layer above said layer of dielectric material;
  forming a layer of photoresist above said cap layer;
  defining a photoresist feature in said layer of photoresist, said feature having a critical dimension;
  reducing the critical dimension of said photoresist feature to produce a reduced size photoresist feature defining an area;
  forming an opening in said dielectric layer in said area defined by said reduced size photoresist feature; and
  forming a conductive material in said opening, wherein forming an opening in said dielectric layer in said area defined by said reduced size photoresist feature comprises:
  partially etching said cap layer to define a plurality of recesses in said cap layer adjacent said reduced size photoresist feature;
  removing said reduced size photoresist feature;
  forming a hard mask layer above said partially etched cap layer;
  planarizing said hard mask layer to expose a portion of said partially etched cap layer between said recesses; and
  etching said dielectric layer in an area defined by said exposed portion of said partially etched cap layer to define an opening in said layer of dielectric material.

23. A method, comprising:
  forming a layer of dielectric material;
  forming a layer of silicon dioxide above said layer of dielectric material;
  forming a layer of photoresist above said layer of silicon dioxide;
  defining a photoresist feature in said layer of photoresist, said feature having a critical dimension;
  reducing the critical dimension of said photoresist feature to produce a reduced size photoresist feature defining an area;
  partially etching said layer of silicon dioxide to define a plurality of recesses in said layer of silicon dioxide, said recesses located adjacent said reduced size photoresist feature;
  removing said reduced size photoresist feature;
  forming a hard mask layer comprised of silicon nitride above said partially etched layer of silicon dioxide;
  planarizing said hard mask layer to expose a portion of said partially etched layer of silicon dioxide between said recesses;
  etching said dielectric layer in an area defined by said exposed portion of said partially etched layer of silicon dioxide to define an opening in said layer of dielectric material; and
  forming a conductive material in said opening.

24. The method of claim 23, wherein forming a layer of dielectric material comprises forming a layer of dielectric material comprised of at least one of silicon dioxide, a carbon-based oxide, and hydrogen silsesquioxane.

25. The method of claim 23, wherein forming a layer of dielectric material comprises forming a layer of dielectric material having a dielectric constant less than five.

26. The method of claim 23, wherein reducing the critical dimension of said photoresist feature to produce a reduced size photoresist feature defining an area comprises performing an ashing process to reduce the critical dimension of said photoresist feature to produce a reduced size photoresist feature defining an area.

* * * * *